(12) United States Patent
Schwarze et al.

(10) Patent No.: US 8,341,895 B2
(45) Date of Patent: Jan. 1, 2013

(54) MOUNTING DEVICE FOR SOLAR MODULES HAVING A LARGE ASPECT RATIO

(75) Inventors: Sascha Oliver Schwarze, Berlin (DE); Maik Schaefer, Berlin (DE)

(73) Assignee: Solon SE, Berlin (DE)

( * ) Notice: Subject to any disclaimer, the term of this patent is extended or adjusted under 35 U.S.C. 154(b) by 241 days.

(21) Appl. No.: 12/537,416

(22) Filed: Aug. 7, 2009

(65) Prior Publication Data

US 2010/0038507 A1    Feb. 18, 2010

(30) Foreign Application Priority Data

Aug. 13, 2008    (DE) .................. 10 2008 037 964

(51) Int. Cl.
     *E04D 13/18*    (2006.01)
     *A47G 29/02*    (2006.01)
     *A47B 91/00*    (2006.01)
     *A47F 7/14*    (2006.01)
     *H01L 31/042*    (2006.01)
     *F25B 29/00*    (2006.01)

(52) U.S. Cl. .................. 52/173.3; 248/237; 248/346.03; 248/488; 136/244; 165/48.2

(58) Field of Classification Search ................. 52/173.3; 126/623; 136/244; 248/237, 346.03, 488; 165/48.2

See application file for complete search history.

(56) References Cited

U.S. PATENT DOCUMENTS

| | | | | |
|---|---|---|---|---|
| 3,938,429 | A * | 2/1976 | Perry | .................. 454/260 |
| 4,645,168 | A * | 2/1987 | Beard | ................... 248/548 |
| 4,663,495 | A * | 5/1987 | Berman et al. | ............. 136/248 |
| 4,837,993 | A * | 6/1989 | Studenski | .................. 52/208 |
| 5,408,774 | A * | 4/1995 | Grewe et al. | ............. 40/606.15 |
| 6,691,965 | B1 * | 2/2004 | Lin | ........................... 248/274.1 |
| 6,703,555 | B2 | 3/2004 | Takabayashi et al. | |
| 6,870,087 | B1 | 3/2005 | Gallagher | |
| 7,435,897 | B2 * | 10/2008 | Russell | .................. 136/244 |
| 7,555,873 | B2 * | 7/2009 | Kilwin et al. | ............... 52/838 |
| 7,915,519 | B2 * | 3/2011 | Kobayashi | ............... 136/251 |
| 7,921,843 | B1 * | 4/2011 | Rawlings | ................ 126/623 |
| 2003/0070368 | A1 * | 4/2003 | Shingleton | ............... 52/173.3 |
| 2003/0111583 | A1 * | 6/2003 | Gaetano | .................. 248/473 |
| 2004/0031220 | A1 * | 2/2004 | Hocker et al. | ............... 52/235 |
| 2006/0118163 | A1 * | 6/2006 | Plaisted et al. | ............. 136/251 |
| 2006/0186391 | A1 * | 8/2006 | Hansen | .................... 256/24 |
| 2007/0157963 | A1 * | 7/2007 | Metten et al. | .............. 136/251 |

(Continued)

FOREIGN PATENT DOCUMENTS

DE      10050021 A1    4/2001

(Continued)

*Primary Examiner* — Phi A
*Assistant Examiner* — Omar Hijaz
(74) *Attorney, Agent, or Firm* — Leydig, Voit & Mayer, Ltd.

(57) ABSTRACT

A mounting device for solar modules having a large aspect ratio in a parallel arrangement on a flat horizontal substrate includes mounting rails having through-holes at predetermined locations. Insertion elements are attached to the mounting rails at the through-holes. Each insertion element includes a one-piece shaped element having a contiguous surface interrupted by an insertion slit configured to receive a lengthwise edge area of a solar module, the insertion slit extending at a predetermined insertion angle. A plastic wedge is configured to secure the received lengthwise edge area of the solar module in the insertion slit.

22 Claims, 5 Drawing Sheets

U.S. PATENT DOCUMENTS

2007/0199222 A1* 8/2007 Turner .................. 40/607.02
2008/0087275 A1* 4/2008 Sade et al. .................. 126/623
2008/0128015 A1 6/2008 Shugar et al.

FOREIGN PATENT DOCUMENTS

| | | |
|---|---|---|
| DE | 10116782 A1 | 10/2002 |
| DE | 10145393 C1 | 5/2003 |
| DE | 20301389 U1 | 3/2004 |
| DE | 202005004236 U1 | 10/2005 |
| DE | 102006042092 A1 | 3/2008 |
| EP | 1833098 A1 | 9/2007 |
| JP | 10339008 A | 12/1998 |
| JP | 2000064523 | 2/2000 |
| JP | 2004015294 B2 | 1/2004 |
| WO | WO 9011590 A1 | 10/1990 |
| WO | WO 9611461 A1 | 4/1996 |
| WO | WO-0012839 | 3/2000 |

* cited by examiner

MOUNTING DEVICE FOR SOLAR MODULES HAVING A LARGE ASPECT RATIO

CROSS REFERENCE TO PRIOR APPLICATIONS

Priority is claimed to German Patent Application No. DE 10 2008 037 964, filed on Aug. 13, 2008, the entire disclosure of which is hereby incorporated by reference herein.

FIELD

The present invention relates to a mounting device for solar modules.

BACKGROUND

U.S. Pat. No. 6,870,087 B1 describes a single-string solar module with a frame configuration in which the frame is rotatably mounted in a support structure so as to allow a slanted orientation towards the sun. Numerous single-string solar modules can be arranged in parallel in a support structure. "Multi-string solar modules" are likewise described. Moreover, multi-string solar modules are described in U.S. Pat. No. 6,703,555 B2, which have been placed on slanted L-shaped concrete members.

International patent application WO 00/12839 A1 describes a mounting device for solar modules having a small aspect ratio on a pitched roof. Cross rails are attached to mounting rails arranged on said pitched roof at places predefined by through-holes. One end of such a cross rail has hinges, while the other end has latching hooks. In this manner, if necessary, rectangular solar modules that have been attached in the hinges can be laid flat, or set up at a predefined inclination angle.

Japanese patent application JP 2000064523 A describes a mounting device for solar modules that have a board-shaped design due to a large aspect ratio. In order to optimally utilize the incident sunlight, many solar modules in a photovoltaic system are arranged in parallel on a concrete surface as the flat horizontal substrate, at a set-up angle slanted towards the incident sunlight. The arrangement is installed by means of a mounting device that consists essentially of mounting rails arranged on the concrete surface and of insertion elements attached thereto. The mounting rails consist of U-shaped sections that are screwed with the opening facing downwards onto the concrete surface. At predefined raster dimensions, the mounting rails have through-holes for securing the insertion elements. Each insertion element consists of two separate metal brackets having different leg lengths that are each screwed into a through-hole. The upper edge of each metal bracket has a double fold so that the edge area of the solar modules can be inserted laterally. Here, in order to minimize the insertion depth of the solar modules, it is provided that the insertion elements are arranged on the side edges of the solar modules. Optionally, the insertion elements can hold one or two solar modules. The distance of the two metal brackets from each other and the difference in the leg lengths of the two metal brackets immutably determine the width and the insertion angle (inclination angle) of the solar modules that are to be inserted. Solar modules positioned in the center can only be dismantled after the adjacent solar modules have been removed or at least after they have been moved aside while the appertaining insertion elements are dismantled. In order to insert the solar modules from the side, an appropriate place on the side is always necessary. Moreover, as a rule, long solar modules have to be mounted by two technicians in order to prevent bending and damage of the solar module.

SUMMARY

In an embodiment, the present invention provides a mounting device for solar modules having a large aspect ratio in a parallel arrangement on a flat horizontal substrate. The mounting device includes mounting rails having through-holes at predetermined locations. The mounting rails are adapted for mounting on the flat horizontal substrate. Insertion elements are attached to the mounting rails at the through-holes. Each insertion element includes a one-piece shaped element having a contiguous surface interrupted by an insertion slit configured to receive a lengthwise edge area of a solar module, the insertion slit extending at a predetermined insertion angle. A plastic wedge is configured to secure the received lengthwise edge area of the solar module in the insertion slit.

BRIEF DESCRIPTION OF THE DRAWINGS

An example of a mounting device for solar modules according to the present invention is presented in the following five figures. Other features and advantages of various embodiments of the mounting device according to the present invention will become apparent by reading the following detailed description with reference to the attached drawings which illustrate the following.

DETAILED DESCRIPTION

In an embodiment, the present invention provides a mounting device for solar modules having a large aspect ratio, where the solar modules are in a parallel arrangement on a flat horizontal substrate with mounting rails arranged thereupon. Insertion elements are attached to the mounting rails at places predefined by through-holes and serve for inserting and securing the solar modules at their edge areas.

Lightweight flat roofs, as flat horizontal substrates, can no longer support standard solar modules that are optimally oriented towards the sun, because of the inadequate load-bearing reserves of such roofs, as a result of which these surfaces are often not used at all for solar energy purposes, or else only with flat and thus low-yield solar modules. In order to keep the loads exerted on obliquely positioned solar modules as low as possible, their height can be kept as small as is technically and economically feasible. Thus, for example, only one solar cell string can be interconnected to one solar module. At the same installed electric power, the load is distributed more uniformly over the flat roof due to the parallel configuration of many single-string solar modules with small surface loads, as compared to standard solar modules with a high local surface load. However, just a few rows of solar cells next to each other ("multi-string solar module" in contrast to "many-string solar module") can still create very narrow solar modules having a large aspect ratio, that is to say, having a great length as compared to their height ("board-shaped" design). Solar modules can have solar cells on glass panes in structural frames or else they can have "laminated" solar cells cast in plastic. Solar modules with solar cells laminated into them can also be referred to as "solar panels" and they are relatively thin. As a rule, solar panels do not have protruding frame constructions, but on the contrary, unused edge areas of the solar panels are used directly for mounting and interconnection purposes. The interconnection is often integrated into the solar panel so that only connection cables are located outside of the laminate. Due to the small surface area that is exposed to wind loads of solar modules having a large aspect ratio—which can be reduced even further by means of wind spoilers—only a very small load is needed to provide security against the panels being lifted by wind. For example, an anchoring or connection to the roof is not absolutely necessary.

According to an embodiment, the present invention provides a mounting device with which board-shaped solar modules can be easily installed in a slanted position on a flat horizontal substrate with simple-to-handle, sturdy insertion elements and can be equally easily removed for maintenance purposes. Moreover, the mounting device may accommodate solar modules having different heights and thicknesses without the need for other insertion elements. It is likewise desirable for the mounting device to be easily adaptable to different set-up angles of the solar modules.

With the mounting device, each insertion element is configured as a compact, one-piece shaped element having a contiguous surface, resulting in easy handling. Moreover, the shaped elements for inserting the solar modules have an attractive appearance and, since they are structurally contiguous, they are largely impervious to dirt and damaging effects. In order to hold the solar modules, the shaped elements have an insertion slit that traverses the otherwise contiguous surface and extends at a predefined insertion angle. A lengthwise edge area of the solar module is inserted into this insertion slit, which is especially advantageous. First of all, the insertion element is no longer adapted to the height of the solar module, as a result of which solar modules of different heights can be attached in one and the same insertion element. Secondly, the solar module does not have to be inserted from the side. In a simple manner, it is inserted from the top into the number of insertion elements provided for a solar module, which can also be carried out by a single technician without any problem and without any damage occurring. The places on the solar module provided for the attachment are inserted directly into the shaped elements. Depending on the length of the solar module, for example, just one shaped element can be provided in the center. Alternatively or additionally, there can be two shaped elements in the end areas of the solar module or three or more shaped elements evenly distributed over the length of the solar module.

Finally, the mounting technique that is completely independent of adjacent solar modules is very well suited when there is a need for the maintenance of individual solar modules during operation. It is easy to dismantle exclusively the affected solar module. It is likewise easy to replace solar modules. The inserted solar module may be secured in place by inserting a simple plastic wedge that clamps the solar module firmly against the insertion slit. Due to the small surface area that is exposed to wind loads, owing to their high aspect ratio, board-shaped solar modules only call for a low fixation force. This force can be exerted without any problem by the above-mentioned plastic wedges. Furthermore, by varying the width of the plastic wedge, or preferably by selecting a plastic wedge that is elastic, the insertion element can be readily adapted to solar modules of different thicknesses.

The mounting device can undergo a number of advantageous, different modifications that even further underscore the practicality and versatility of the invention, along with great simplicity. Solar modules with and without frames can be mounted. Particularly with an embodiment of the solar modules as frame-less solar panels, the fact that they are thin lends itself quite well for the mounting principle, so that the use of solar panels is preferred according to an embodiment of the present invention. Moreover, the solar modules can be set up at any desired inclination angle with respect to the sun. An appropriate orientation of the insertion slit in the shaped elements can easily be created at the time of their production. For example, an inclination angle of 35° relative to the horizontal substrate can be selected for the radiation of a surface of the solar module. However, it is also possible to select an inclination angle of 90°, so that the solar modules are then arranged perpendicularly and thus orthogonally to the horizontal substrate. Such an arrangement is especially well-suited if bifacial solar modules, whose solar cells can process incident sunlight on both sides, are used. In order to further improve the utilization of the incident sunlight, appropriate reflectors can be provided between the solar modules in a horizontal or inclined configuration.

Moreover, according to a preferred embodiment of the present invention, the plastic wedge can engage with a fixation slit adjacent to the insertion slit, whereby said fixation slit is deeper than the insertion slit. As a result, the support surface for the plastic wedge is increased, so that a reliable fixation of the solar module in the insertion slit can be achieved. The solar module may be dismantled after first removing the plastic wedge. Moreover, the insertion slit can have a cable bushing leading into the cavity of the shaped element. From there, the cables can then be easily fed elsewhere. In this embodiment, the contiguous surface of the employed shaped elements remains unimpeded, since no cables are visible. Moreover, this improves the operational safety since the cables can be laid so as to be protected inside the shaped elements. The operational safety can be further increased if the shaped element advantageously has a cable relief in the cavity. This reliably prevents the cable from being severed from the solar module due to an excessive application of force. No tensile force is exerted at the site where the cable is connected to the solar module. Finally, the outer contour of the shaped elements is not interrupted, so that the attractive appearance is also retained since the plastic wedge is positively connected to the outer contour of the shaped element. The plastic wedge can be a prefabricated mounting element that is inserted and wedged into the insertion slit. However, a simple method for installing the plastic wedge can also comprise the approach of making the plastic wedge out of filling compound that is applied after the solar module has been inserted into the fixation slit. If, for example, the fixation slit has a filling opening for applying the filling compound from the cavity of the shaped element, then the filling compound, for example, a silicon compound, can be easily injected through this opening. If a template is first placed onto the top of the shaped element, then it can be achieved that the plastic wedge lies flush with the top of the shaped element, creating a positive connection. However, it is also possible to subsequently modify the shape of the applied filling compound, for example, by simply cutting it off with a knife.

Moreover, it is advantageous if the bottom of the shaped elements has guide grooves that engage with corresponding guide strips in the mounting rail so that the shaped elements can be precisely positioned on the mounting rails. In order to achieve a simple mounting of the shaped elements, it is advantageous for each shaped element to be attached to the mounting rail through at least one through-hole in that an angled element engages through the through-hole from below and has a positive recess in the leg that passes through, and this positive recess engages with a negative recess that is located on the bottom of the shaped element. The negative recess that is located on the shaped elements can engage with the positive recesses of the angled elements, for example, through a slight lengthwise shift of the shaped elements on the guide strips of the mounting rails.

Along with the ease of handling of the shaped elements, they are also not prone to malfunction and have an attractive appearance. Prior-art insertion elements do not exhibit these aspects since they are configured as simple hooks. According to an embodiment of the present invention, the shaped elements can be configured as half-shells, whereby a support wall runs through the center of the cavity. This yields an especially compact but functional shape that can look like a computer mouse. In contrast to a full-element configuration, a half-shell configuration of the shaped elements entails less weight and better handling characteristics, especially better accessibility from the inside. The central support wall provides the requisite mechanical strength. Advantageously, the support wall can also have the negative recess, the cable relief and/or a guide groove. Another improvement of the shape is obtained when the shaped element is open on both lengthwise sides, this especially results in an optimal accessibility of the cavity, also in the mounted state. Finally, owing to the shaping and the moderate force conditions due to the low wind loads, it lends itself for the shaped elements to be made of plastic, for example, as simple injection-molded parts. If green plastic is used, the shaped elements remind one of frogs, so that the name "solfrog" can be selected.

As set forth above, the number of shaped elements provided per solar module depends on its length. Very short solar modules can be slid into the center of a single shaped element. However, for purposes of ensuring a non-tilting positioning, it is advantageous for at least two shaped elements to be provided per solar module and for these shaped elements to be attached in two parallel mounting rails at a distance from each other.

In order to reduce the weight and so that the water can run off, the mounting rails can have a raster-like perforated pattern, whereby in the area of the through-holes, there is no perforated pattern so as to ensure a secure attachment of the shaped elements. Moreover, the mounting rails can have side edges that are bent upwards. If the shaped element, whose width is appropriately dimensioned, is arranged centrally in the mounting rail, a cable channel is formed between the shaped element and each side edge, where the cables coming from the cavity of the shaped elements can be collected and laid. In order to adapt the length of the mounting rails to the size of the horizontal substrate, it is also advantageous for the front and back ends of the mounting rails to have connection elements for additional mounting rails, so that lengthening can be achieved by simply clicking such elements together, for example, through a tongue and groove system. Owing to the variable arrangement of the mounting rails next to each other and to the adaptability of their length to the substrate, the entire substrate can be provided with a solar installation consisting of numerous parallel and serial solar modules. Here, in view of the small surface area that is exposed to wind loads, the mounting rails do not necessarily have to be attached to the substrate, for example, by means of screws. Nevertheless, affixing them increases the operational safety of the system and can preferably be done, for example, in that the mounting rails are affixed onto the horizontal substrate by means of a layer of gravel or sand.

Additional details about the mounting device for solar modules having a large aspect ratio can be gleaned from the embodiment described below. Although this embodiment is a preferred version of the mounting device according to the invention, it is not limited to this. Rather, versatile configuration possibilities exist for the mounting device according to the invention, based on the compact shaped element in the form of an insertion element with an insertion slit.

Figure 1:
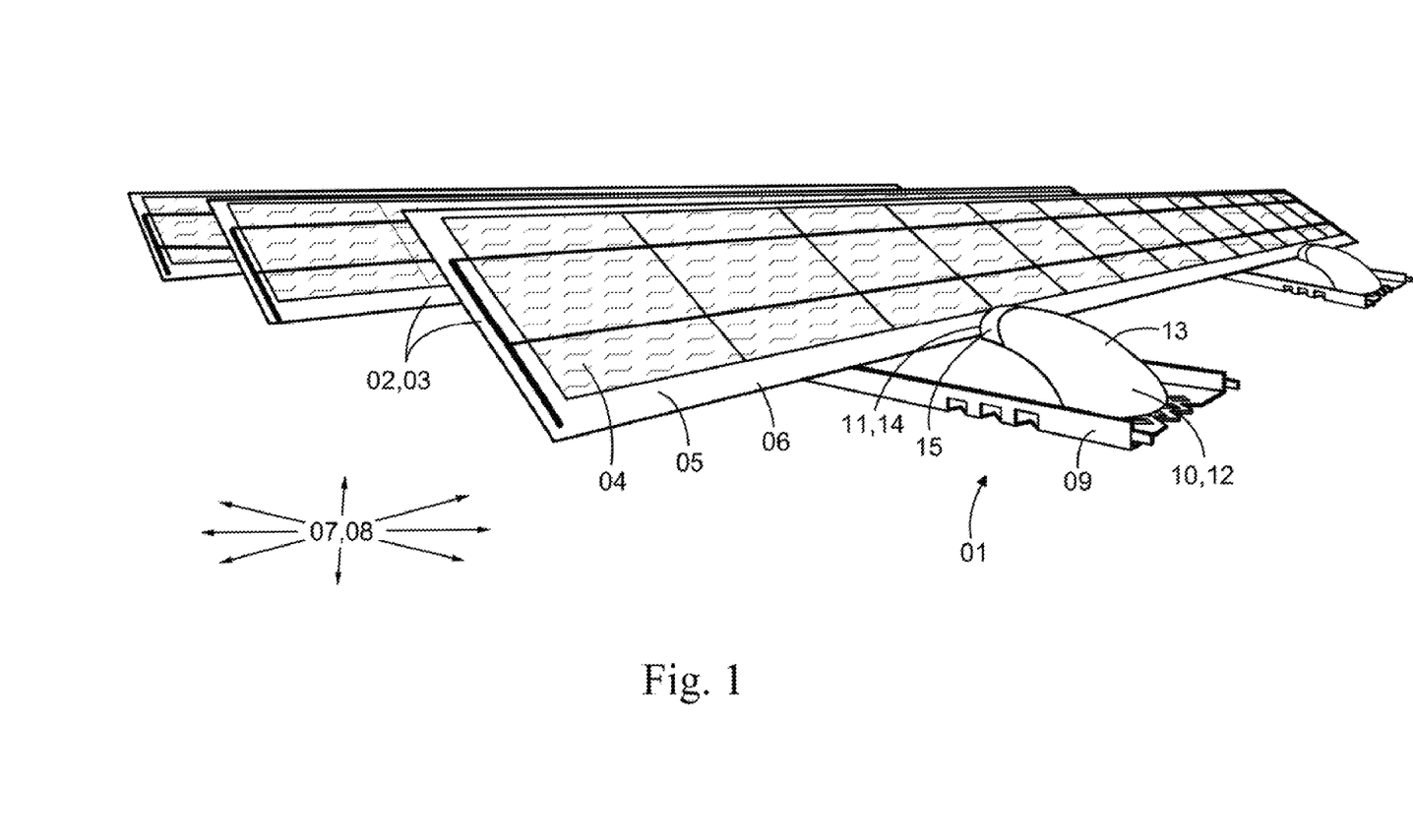
FIG. 1 a perspective view of the mounting device.

FIG. 1 shows a perspective view of the mounting device 01 according to the invention. The mounting device 01 is suitable for mounting solar modules 02 having a large aspect ratio, that is to say, having a very great length as compared to their height. A single-string solar module 03 with a single row of crystalline solar cells 04 is shown. Single-string solar modules 03 have a board-shaped design and entail the advantage of a small height, so that the wind-exposure loads are correspondingly low. Moreover, the single-string solar module 03 shown is configured as a frame-less solar panel 05 whose edge area 06 is used for the mounting. Numerous solar modules 02 are arranged in parallel on a flat horizontal substrate 07, here a flat roof 08. A slanted arrangement for the optimal orientation of a surface of the solar modules 03 in the direction of the main sunlight exposure is shown. A vertical arrangement of the solar modules 03 (insertion angle 90°) orthogonally to the horizontal substrate 07 is likewise possible. This is advantageous if bifacial solar cells are used, which can be photovoltaically active on both sides. Reflectors can then be provided between the solar modules 03.

The mounting device 01 consists mainly of mounting rails 09 and of insertion elements 10 attached to the mounting rails 09 at places predefined by through-holes (see FIG. 4) for inserting and securing the solar modules 02 in their edge area 06. A mounting arrangement is shown that uses two insertion elements 10 per solar module 02, which are attached in two parallel mounting rails 09 at a distance from each other. Each insertion element 10 is configured as a compact, one-piece shaped element 12 having a contiguous surface 13, which is interrupted by an insertion slit 14 that extends at a predefined insertion angle 11. The solar module 02 is inserted into the insertion slit 14 at its lengthwise edge area 06 and secured by a plastic wedge 15.

Figure 2A:
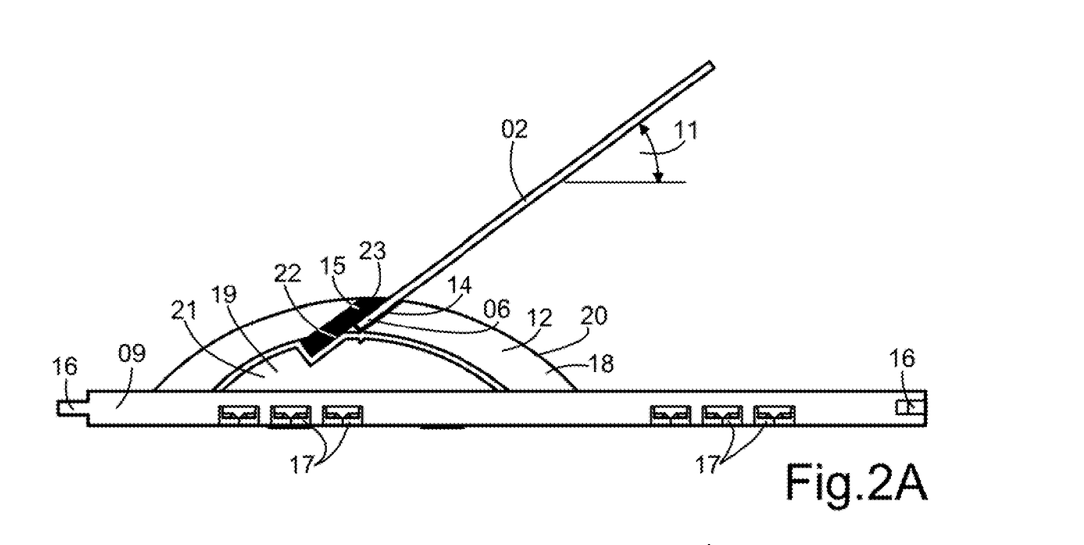
FIG. 2A a side view of the mounting device.

FIG. 2A shows a side view of the mounting rail 09 and a compact, one-piece shaped element 12. The ends of the mounting rail 09 have connection elements 16, here a tongue and groove, that allow a connection to additional mounting rails 09. Moreover, cutouts 17 that serve to minimize the weight can be seen (see FIG. 4). The shaped element 12 consists of a half-shell 18 that is open on both lengthwise sides 19 and that has a contiguous surface 20. Below the open lengthwise sides 19, a central support wall 21 can be seen. The surface 20 is pierced by the insertion slit 14 which, in the embodiment shown, is arranged so as to be slanted. The solar module 02 is inserted into the insertion slit 14 at its edge area 06 and is thus positioned below the insertion angle 11 of the insertion slit 14. The plastic wedge 15 is inserted into an adjacent fixation slit 22 and it clamps the solar module 02. Here, for purposes of further stabilization, the fixation slit 22 has a greater depth than the insertion slit 14. Due to the fact that there is an open space between the insertion slit 14 and the fixation slit 22, solar modules 02 of different thicknesses can be inserted and affixed by an appropriate plastic wedge 15. For this purpose, said wedge can either have a different thickness or it can be configured so as to be elastic, so that it is clamped by deformation. When silicon compound is used for the plastic wedge 15, the solar module 02 is additionally secured by (detachable) adhesion. The plastic wedge 15 conforms with a positive fit to the outer contour 23 of the shaped element 12.

Figure 2B:
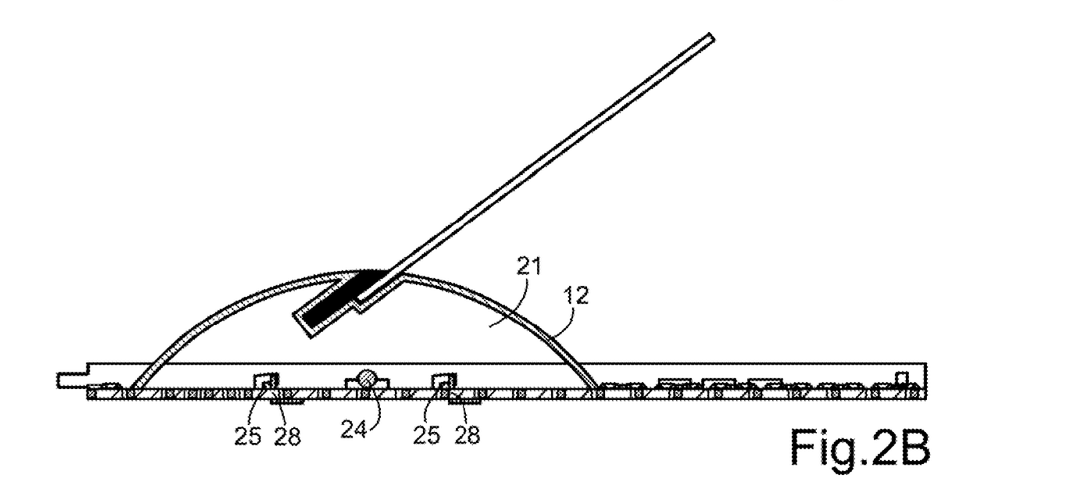
FIG. 2B a section through the mounting device.
Figure 2C:
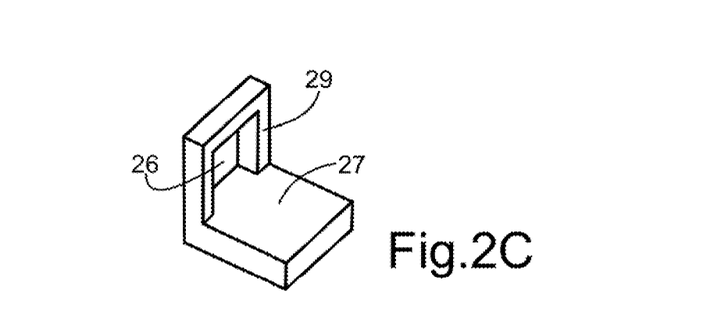
FIG. 2C a perspective view of a detail of the mounting device.

FIG. 2B shows a lengthwise section through the shaped element 12 in the area of the central support wall 21. A cable relief 24 for the connection cable of the solar module 02 can be seen in the center. Moreover, two negative recesses 25 are shown that engage with positive recesses 26 of angled elements 27, as is shown in detail in FIG. 2C. The angled elements 27, in turn, engage with the mounting rail 09 from below through the through-holes 28 (see FIG. 4). The positive recess 26 is situated in the leg 29 that passes through and that is situated on the angled element 27. By moving the shaped element 12 laterally, all of the negative recesses 25 in the support wall 21 of the shaped element 12 simultaneously engage with the positive recesses 26 of angled elements 27 passing through the mounting rail 09, thereby locking the shaped element 12 with the mounting rail 09. The shaped elements 12 can be detached in a simple manner by correspondingly pushing the shaped element 12 back. This avoids the need for screwed connections, which are difficult to handle, in order to connect the shaped element 12 to the mounting rail 09.

Figure 3A:
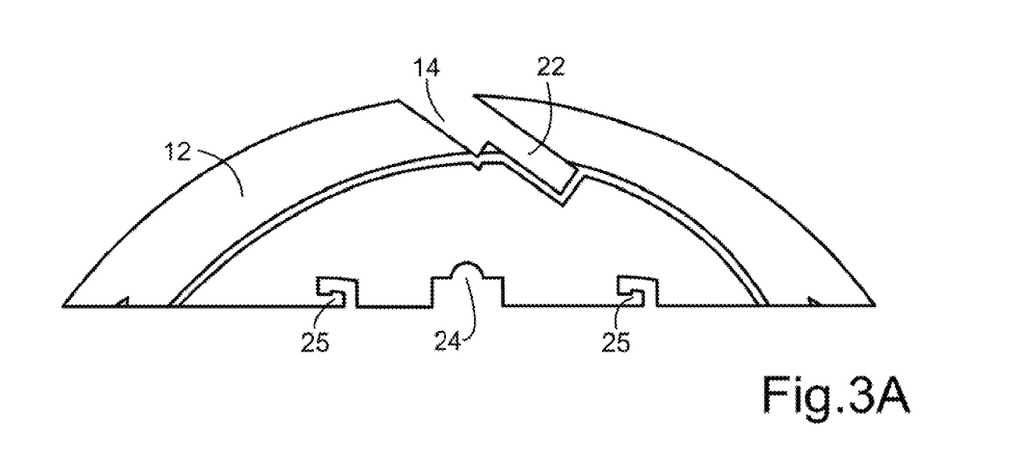
FIG. 3A a side view of the shaped element.
Figure 3B:
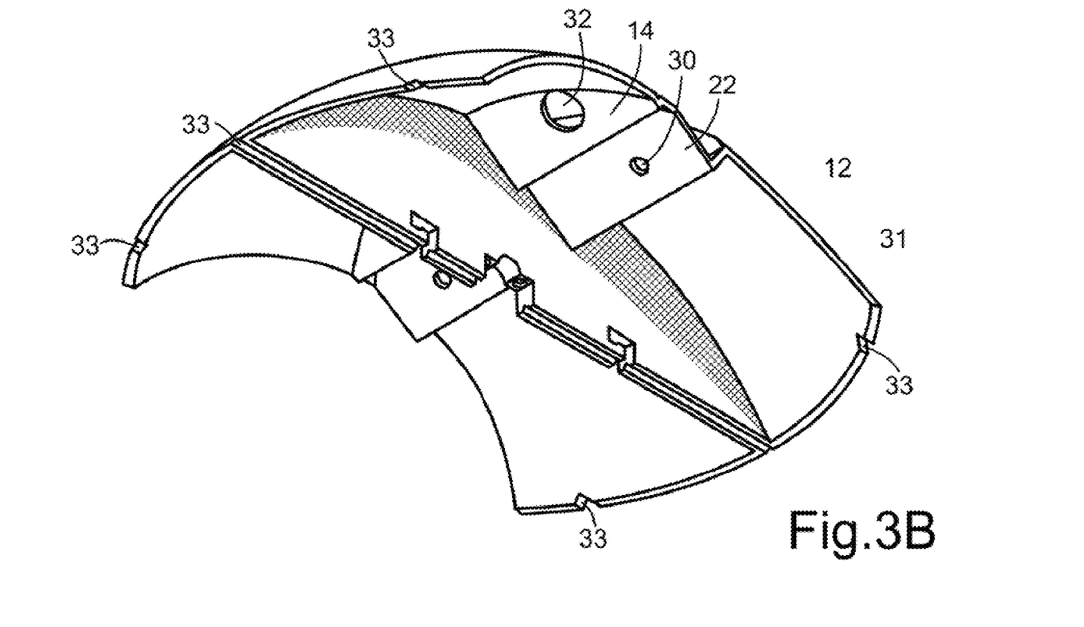
FIG. 3B a perspective view into the cavity of the shaped element.

FIG. 3A shows a side view of the shaped element 12 without the mounting rail 09 and the solar module 02. The insertion slit 14, the fixation slit 22, the negative recesses 25 and the indentation for the cable relief 24 can be clearly seen in this view. FIG. 3B shows a perspective bottom view of the shaped element 12. A filling opening 30 for applying the filling compound into the cavity 31 of the shaped element 12 is arranged in the area of the fixation slit 22. After the solar module 02 has been inserted, silicon, for example, can be injected through this filling opening 30 in order to create the plastic wedge 15. A cable bushing 32 into the cavity 31 of the shaped element 12 is arranged in the area of the insertion slit 14. A cable that has been pulled through can be cast directly together with the plastic wedge 15, resulting in a waterproof conduit. Moreover, it can be seen in FIG. 3B that the bottom of the shaped element 12 has guide grooves 33 that serve for the proper axial positioning of the shaped element 12 on the mounting rail 09. Lateral guide grooves 33 are formed by notches in the wall of the shaped element 12, and a center guide groove 33 runs precisely in the central support wall 21.

Figure 4:
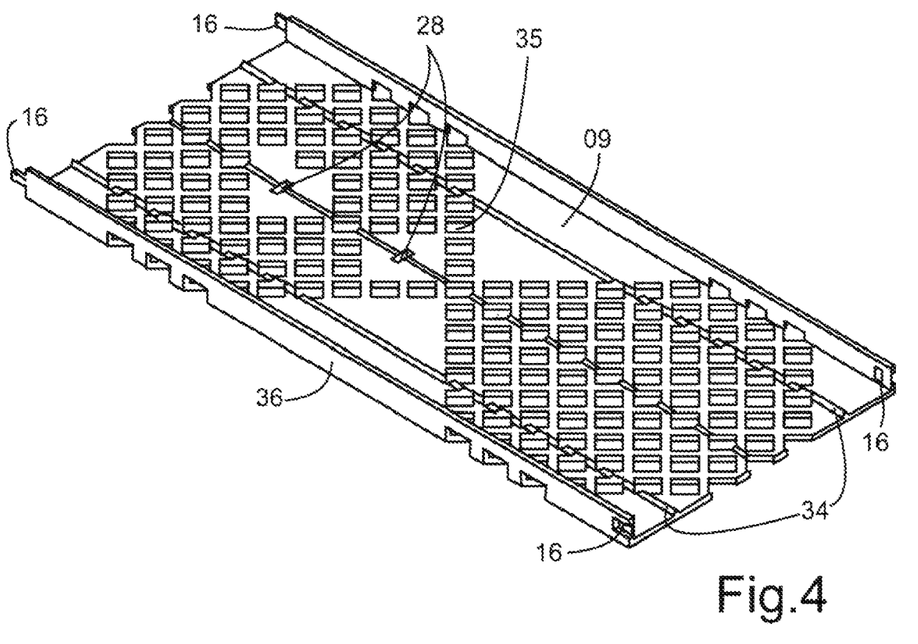
FIG. 4 a perspective view of the mounting rail.
Figure 5A:
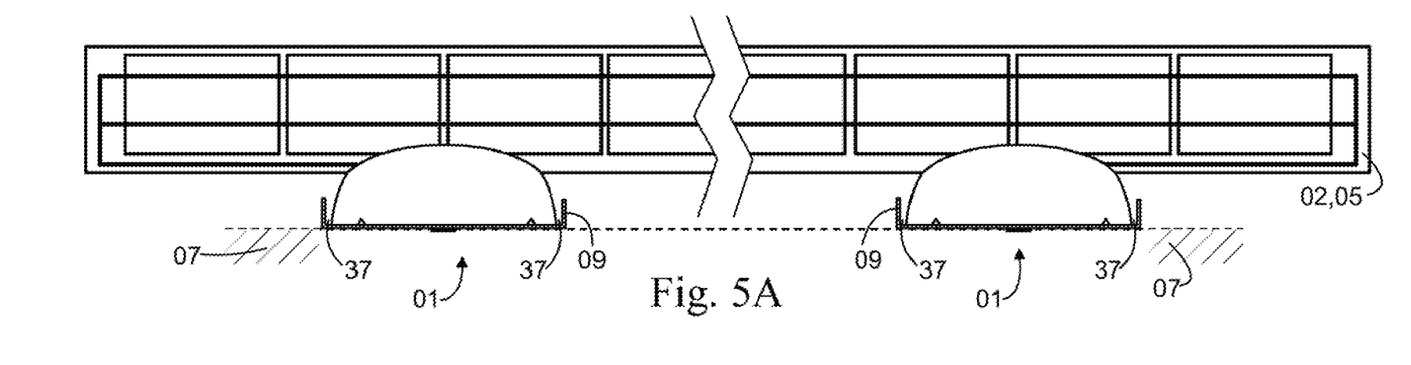
FIG. 5A a front view of the mounting device with dimensions.

FIG. 4 shows a perspective view of a mounting rail 09. The guide strips 34 can engage with the guide grooves 33 of the shaped elements 12. Moreover, the mounting rail 09—in addition to the through-holes 28 (in the embodiment shown, two per shaped element 12) that are provided for the angled elements 27—has a perforated hole pattern 35 that serves to reduce the weight and thus to ensure easier handling. Moreover, water can run off more easily, so that no moisture can accumulate. For stabilization purposes, there is no hole pattern 35 in the area of the through-holes 28. The mounting rail 09 has side edges 36 that are bent upwards. In FIG. 5A, it is shown that the shaped elements 12 are arranged centrally in the mounting rail 09 so that cable channels 37 are formed to the left as well as to the right of the shaped element 12. The connection cables of the solar modules 02 that are laid into the cavity 31 of the shaped element 12 can simply continue in these cable channels 37. The mounting rail has a connection element 16, here a tongue and groove, on the bent-up side edges 36, so that additional mounting rails 09 can be connected. The mounting rail 09 can be affixed. for example, by screwed connections, to the horizontal substrate 07. However, this is relatively complicated, and causes damage to the roof skin. Due to the low wind loads, it is sufficient to use a less sturdy fixation, which can easily be removed and re-established, such as, for example, a layer of gravel or sand. This is put in place after all of the solar modules 02 have been mounted and the connection cables have been laid.

Figure 5B:
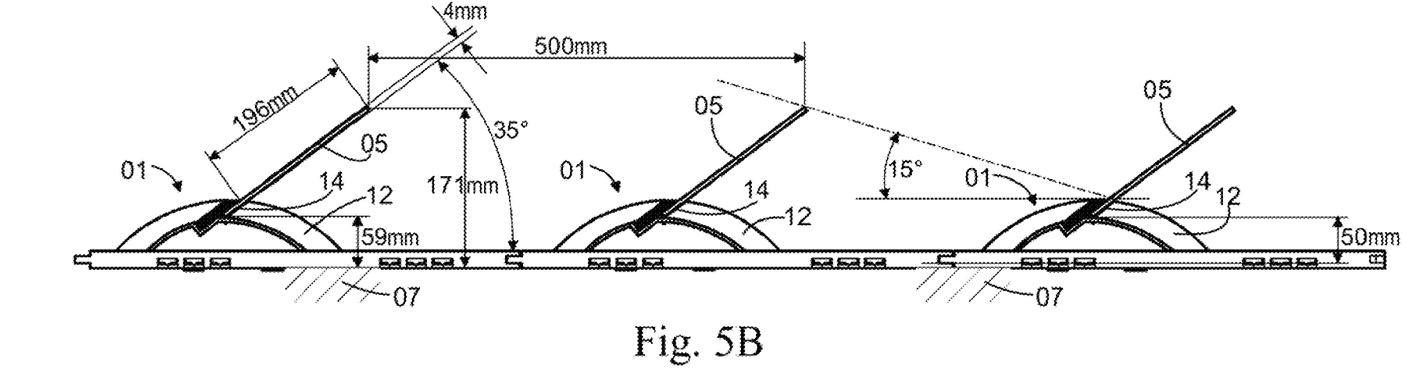
FIG. 5B a side view of the mounting device with dimensions.

FIGS. 5A and 5B show several dimensions in order to illustrate the size relationships. FIG. 5A shows a front view of the mounting device 01 according to the invention with two mounting rails 09 and two shaped elements 12 for a board-shaped solar module 02 in a configuration as a solar panel 05 having a length of 2094 mm, a height of 196 mm and a thickness of 4 mm. The two shaped elements 12 are arranged on the outer quadrants of the solar module 02.

Finally, FIG. 5B shows dimensions in the side view. The outer edge of the shaped elements 12 reaches a height of 58.92 mm, the insertion angle 11 is 35° relative to the horizontal substrate 07, so that the upper end of the solar panel 05 is at a distance of 171.34 mm from the horizontal substrate 07. The shaped elements 12 (which may be referred to as "Solfrog" when made of green plastic) have a height of 70 mm and a width of 150 mm. The insertion slit 14 has a depth of 20 mm. The individual shaped elements 12 are arranged at a distance of 500 mm from each other, resulting in a compact solar energy system with numerous solar modules 02 arranged in parallel. An especially advantageous aspect of this embodiment of a solar energy system is its small surface area that is exposed to wind loads so that, for the relatively small forces that occur, the mounting device 01 can be used, which is particularly lightweight and easy to handle, and which also has a very attractive appearance.

While the invention has been particularly shown and described with reference to preferred embodiments thereof, it will be understood by those skilled in the art that various changes in form and details may be made therein without departing from the spirit and scope of the invention. Accordingly, the invention is to be limited only by the scope of the claims and their equivalents.

LIST OF REFERENCE NUMERALS 01 mounting device
02 solar module
03 single-string solar module
04 solar cell
05 solar panel
06 edge area
07 horizontal substrate
08 flat roof
09 mounting rail
10 insertion element
11 insertion angle
12 shaped element
13 surface
14 insertion slit
15 plastic wedge
16 connection element
17 cutout
18 half-shell
19 lengthwise side
20 surface
21 support wall
22 fixation slit
23 outer contour
24 cable relief
25 negative recess 26 positive recess
27 angled element
28 through-hole
29 leg
30 filling opening
31 cavity
32 cable bushing
33 guide groove
34 guide strip
35 hole pattern
36 side edge
37 cable channels

What is claimed is:

1. A mounting device for solar modules having a large aspect ratio in a parallel arrangement on a flat horizontal substrate, the mounting device comprising:
mounting rails having through-holes at predetermined locations corresponding to the parallel arrangement, the mounting rails being adapted for mounting on the flat horizontal substrate;
insertion elements attached to the mounting rails at the through-holes, each insertion element includes a one-piece shaped element having a contiguous surface interrupted by an insertion slit configured to receive a lengthwise edge area of a solar module, the insertion slit extending at a predetermined insertion angle that is one of inclined or perpendicular relative to the flat horizontal substrate; and
a plastic wedge is configured to secure the received lengthwise edge area of the solar module in the insertion slit.

2. The mounting device according to claim 1, wherein the insertion slit is configured to receive the solar module including a bifacial solar module having a respective photovoltaically active surface on respective sides thereof.

3. The mounting device according to claim 1, wherein each insertion element includes a fixation slit adjacent to the insertion slit, the fixation slit being deeper than the insertion slit and wherein the plastic wedge is configured to engage with the fixation slit.

4. The mounting device according to claim 1, wherein the plastic wedge is elastic.

5. The mounting device according to claim 1, wherein the plastic wedge is configured to conform with a positive fit to an outer contour of the shaped element.

6. The mounting device according to claim 1, wherein the insertion slit includes a cable bushing leading into a cavity of the shaped element.

7. The mounting device according to claim 1, wherein a cavity of the shaped elements includes a cable relief.

8. The mounting device according to claim 1, wherein the plastic wedge is formed from a filling compound that is applied, after the lengthwise edge area of the solar module has been received in the insertion slit, into a fixation slit adjacent to the insertion slit.

9. The mounting device according to claim 8, wherein the fixation slit includes a filling opening for applying the filling compound from a cavity of the shaped element.

10. The mounting device according to claim 1, wherein the shaped element includes guide grooves at bottom portions thereof that are configured to engage with corresponding guide strips in the mounting rail.

11. The mounting device according to claim 1, further comprising angled elements, wherein the shaped elements are attached to the mounting rails through the through holes, the angled elements being configured to engage with the mounting rails through the through-holes from below, each angled element including a positive recess in a leg passing through a respective through-hole, the positive recess being configured to engage with a negative recess disposed on a bottom of a respective shaped element.

12. The mounting device according to claim 1, wherein the shaped element is shaped as a half-shell and includes a support wall disposed through a center region of a cavity of the shaped element.

13. The mounting device according to claim 12, wherein the support wall includes at least one of a negative recess, a cable relief, and a guide groove.

14. The mounting device according to claim 12, wherein the shaped element is open on lengthwise sides thereof.

15. The mounting device according to claim 1, wherein the shaped element is made of plastic.

16. The mounting device according to claim 1, wherein at least two shaped elements are provided for each solar module, the shaped elements being attached in two of the mounting rails disposed parallel at a distance from one another.

17. The mounting device according to claim 1, wherein the mounting rails have a raster-like perforated pattern outside of areas of the through-holes.

18. The mounting device according to claim 1, wherein the mounting rails include side edges that are bent upwards and a respective one of the shaped elements is disposed centrally in each of the mounting rails, the shaped elements having a predetermined width so as to form a cable channel between each shaped element and each side edge.

19. The mounting device according to claim 1, wherein the mounting rails include front and back ends having connection elements for additional mounting rails.

20. The mounting device according to claim 1, wherein the insertion slit is configured to receive the solar module including a frame-less solar panel having a length of approximately 2000 mm, a height of approximately 200 mm and a thickness of approximately 4 mm, wherein the shaped elements have a height of approximately 70 mm, a width of approximately 150 mm, and wherein the insertion slits extend at an insertion angle of 35° relative to the horizontal substrate and have an insertion depth of approximately 20 mm, the shaped elements being at a distance of approximately 500 mm from each other in a parallel arrangement of solar panels.

21. The mounting device according to claim 1, wherein the plastic wedge is configured to be disposed in the insertion slit so as to secure the solar module from only a single side of the solar module.

22. The mounting device according to claim 1, wherein the insertion angle is between 35° and 90° relative to the flat horizontal substrate.

* * * * *